(12) United States Patent
Li et al.

(10) Patent No.: US 11,158,624 B1
(45) Date of Patent: Oct. 26, 2021

(54) CASCODE CELL

(71) Applicant: GLOBALFOUNDRIES U.S. INC., Santa Clara, CA (US)

(72) Inventors: Wenjun Li, Saratoga Springs, NY (US); Chen Perkins Yan, Malta, NY (US); Tamilmani Ethirajan, Guilderland, NY (US); Cole E. Zemke, Brownsburg, IN (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/857,298

(22) Filed: Apr. 24, 2020

(51) Int. Cl.
*H01L 27/08* (2006.01)
*H01L 27/02* (2006.01)
*H01L 27/088* (2006.01)
*H01L 29/08* (2006.01)
*H01L 29/423* (2006.01)
*H01L 21/8234* (2006.01)
*H03F 3/195* (2006.01)
*H01L 27/12* (2006.01)

(52) U.S. Cl.
CPC .. *H01L 27/0207* (2013.01); *H01L 21/823425* (2013.01); *H01L 21/823431* (2013.01); *H01L 21/823456* (2013.01); *H01L 21/823475* (2013.01); *H01L 27/0886* (2013.01); *H01L 27/1211* (2013.01); *H01L 29/0847* (2013.01); *H01L 29/42376* (2013.01); *H03F 3/195* (2013.01); *H03F 2200/451* (2013.01); *H03F 2200/72* (2013.01); *H03F 2200/75* (2013.01)

(58) Field of Classification Search
CPC ..... H01L 21/823425; H01L 21/823431; H01L 21/823456; H01L 21/823475; H01L 27/088; H01L 27/0886; H01L 27/1203; H01L 27/1211; H01L 29/41766; H01L 29/41791; H01L 29/42372; H01L 29/42376; H01L 29/66568; H01L 29/66795; H01L 29/78; H01L 29/785; H03F 3/195; H03F 2200/451; H03F 2200/72; H03F 2200/75
See application file for complete search history.

(56) References Cited

U.S. PATENT DOCUMENTS

| 6,809,386 B2 | 10/2004 | Chaine et al. |
| 8,418,120 B2 * | 4/2013 | Lu .................. G06F 30/39 716/132 |

(Continued)

FOREIGN PATENT DOCUMENTS

JP 2014165259 9/2014

*Primary Examiner* — Stephen W Smoot
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to unitary Cascode cells with resistance and capacitance optimization, and methods of manufacture. The structure includes a common source FET (CS-FET) in a first portion of a single common semiconductor region, the CS-FET comprising a source region and a drain region, a common gate FET (CG-FET) in a second portion of the single common semiconductor region, the CG-FET comprising a source region and a drain region, and a doped connecting region of the single common semiconductor region, connecting the drain of the CS-FET and the source of the CG-FET.

20 Claims, 3 Drawing Sheets

(56) References Cited

U.S. PATENT DOCUMENTS

| | | | |
|---|---|---|---|
| 9,118,284 B1* | 8/2015 | Komiak | H03F 3/601 |
| 9,413,309 B1* | 8/2016 | Zhao | H03F 3/45188 |
| 9,634,003 B2 | 4/2017 | Jain et al. | |
| 10,503,187 B1* | 12/2019 | Hodge, Jr. | H02M 1/08 |
| 2004/0120175 A1 | 6/2004 | Schrom et al. | |
| 2009/0174480 A1* | 7/2009 | Lee | H03F 1/565 |
| | | | 330/277 |
| 2010/0259329 A1* | 10/2010 | Tserng | H03F 3/195 |
| | | | 330/277 |
| 2015/0340997 A1* | 11/2015 | Kato | H01L 27/0207 |
| | | | 330/277 |
| 2017/0141126 A1* | 5/2017 | Willard | H01L 29/0649 |
| 2018/0233578 A1* | 8/2018 | Shi | H01L 29/7835 |
| 2019/0035919 A1* | 1/2019 | Jain | H01L 21/76224 |
| 2019/0081597 A1* | 3/2019 | Jain | H03F 1/223 |

* cited by examiner

CASCODE CELL

FIELD OF THE INVENTION

The present disclosure relates to semiconductor structures and, more particularly, to unitary Cascode cells, and methods of manufacture.

BACKGROUND

Cascode cells are used in semiconductor devices for forming Cascode amplifier circuits having excellent characteristics in terms of input/output isolation and high bandwidth. Cascode amplifiers are typically constructed using two field effect transistors (FETs) connected to one another, specifically, an input common-source FET (CS-FET) and an output common-gate FET (CG-FET). In particular, a gate of the CS-FET receives an RF input signal, a drain of the CS-FET is connected to a source of the CG-FET, and an output of the Cascode amplifier is provided from a drain of the CG-FET. The CS-FET and the CG-FET are coupled to other circuit elements, including resistors, inductors and capacitors, to construct the complete Cascode amplifier circuit.

In conventional Cascode amplifiers, the CS-FETs and the CG-FETs are formed in separate cells from one another, for example, as separate islands in a substrate, or in separate substrates. In either case, the drain of a CS-FET is connected to the source of its corresponding CG-FET by a metallization layer, such as a backend-of-the-line (BEOL) metallization layer or a middle-of-the-line (MOL) metallization layer between the separate island regions or separate substrates in which the CS-FET and the CG-FET are respectively formed. The metallization layer used to connect the CS-FET and the CG-FET creates additional resistance (e.g., gouging resistance and metal resistance) and additional capacitance (e.g., parasitic capacitance), which tends to deteriorate gain and linearity of the Cascode amplifier.

SUMMARY

In an aspect of the disclosure, a structure comprising: a common source FET (CS-FET) in a first portion of a single common semiconductor region, the CS-FET comprising a source region and drain region; a common gate FET (CG-FET) in a second portion of the single common semiconductor region, the CG-FET comprising a source region and drain region; and a doped connecting region of the single common semiconductor region, connecting the drain of the CS-FET and the source of the CG-FET.

In an aspect of the disclosure, a structure comprising: a common source FET (CS-FET) in a first portion of a single common semiconductor region; and a common gate FET (CG-FET) in a second portion of the single common semiconductor region, wherein the single common semiconductor region is a jogged semiconductor region having different widths in different portions of the single common semiconductor region.

In an aspect of the disclosure, a method of forming a Cascode cell comprising: forming a common source FET (CS-FET) in a first portion of a single common semiconductor region, the CS-FET comprising a source region and drain region; forming a common gate FET (CG-FET) in a second portion of the single common semiconductor region, the CG-FET comprising a source region and drain region; and forming a doped connecting region in the single common semiconductor region, connecting the drain of the CS-FET and the source of the CG-FET, wherein the single common semiconductor region is a jogged semiconductor region having different widths in different portions of the single common semiconductor region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
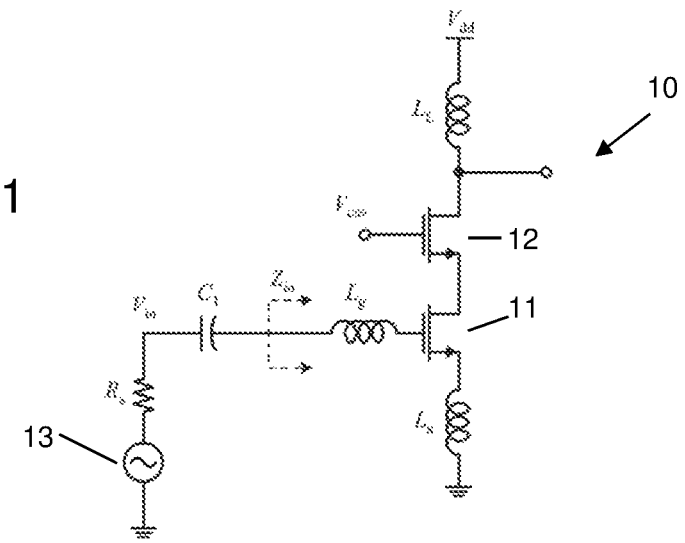
FIG. 1 shows an electrical schematic diagram of a Cascode amplifier which utilizes a unitary Cascode cell in accordance with aspects of the present disclosure.

The present disclosure relates to semiconductor structures and, more particularly, to unitary Cascode cells optimization, and methods of manufacture. More specifically, the present disclosure relates to unitary Cascode cells that are provided on a single common semiconductor region, which includes a doped connecting region connecting a drain of the CS-FET with a source of the CG-FET, without the need for a metallization connecting these drain and source regions. Advantageously, the unitary Cascode cells have reduced parasitic capacitance and resistance, in addition to reduced area size.

In known arrangements of a Cascode amplifier, a first semiconductor region (e.g., an island region or a substrate) is provided for the CS-FET transistor of the Cascode amplifier, and a separate second semiconductor region (e.g., an island region or a substrate) is provided for the CG-FET transistor of the Cascode amplifier. In this type of structure, each CS-FET and each CG-FET has a source region, drain region, and a channel region, located under a gate electrode, between the source region and the drain region. A shallow trench isolation region is used to ensure isolation between the first semiconductor region, where the CS-FET is formed, and the second semiconductor region, where the CG-FET is formed, thereby ensuring that the first and second semiconductor regions are separate semiconductor island regions in a substrate. On the other hand, the first semiconductor region in which the CS-FET is formed and the second semiconductor region in which the CG-FET is formed can be separate silicon substrates formed on an underlying insulator (e.g., an SOI structure). In either case, the drain of the CS-FET, formed in the first semiconductor region, and the source of the CG-FET, formed in the second semiconductor region, are connected by a metallization layer (such as a BEOL or a MOL metallization layer) extending between the first and second semiconductor regions. The requirement for this metallization layer connection increases the overall size of the Cascode cell, and adds undesirable resistance (e.g., gouging resistance) and capacitance (e.g., parasitic capacitance) to the device.

In contrast, the CS-FETs and the CG-FETs of the present disclosure are integrated in a single common semiconductor region forming a unitary Cascode cell. In particular, a connecting region, serving as a floating internal node, is provided in the single common semiconductor region to serve as a drain of the CS-FET, a source of the CG-FET, and a connection between the drain of the CS-FET and the source of the CG-FET. This eliminates the metallization layer used in known structures which are required to connect the drain of the CS-FET and the source of the CG-FET. The structure described herein also eliminates the need for a separate source region in a first semiconductor region where the CS-FETs are conventionally formed and a separate drain region in a second semiconductor region where the CG-FETs are conventionally formed. Thus, size, resistance and capacitance for the Cascode amplifier are all reduced.

In other words, in embodiments, Cascode cells are provided with the CS-FETs and the CG-FETs integrated on the same jogged single common semiconductor region to reduce cell area, wiring resistance and capacitance. Also, in embodiments, the CG-FETs have a smaller width than the CS-FETs. Further, since doped connecting regions are provided as floating nodes between drains of the CS-FETs and sources of the CG-FETs, MOL or BEOL contacts conventionally used for connecting these drains and sources can be eliminated.

In accordance with another aspect of the present disclosure, the single common semiconductor region can be jogged to have different widths in different portions thereof. Specifically, in this arrangement, the single common semiconductor region is jogged to be wider in a portion of the single common semiconductor region where the CS-FET is formed and to be narrower in a portion of the single common semiconductor region where the CG-FET is formed. This allows the CG-FET to handle more voltage so that the CS-FET can have a smaller gate length $L_G$, thereby improving gain of the Cascode amplifier constructed with the unitary Cascode cell.

The CS-FET and CG-FET transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the CS-FET and CG-FET transistors of the present disclosure have been adopted from integrated circuit (IC) technology. For example, the structures are built on wafers and are realized in films of material patterned by photolithographic processes on the top of a wafer. In particular, the fabrication of the CS-FET and CG-FET transistors uses three basic building blocks: (i) deposition of thin films of material on a substrate, (ii) applying a patterned mask on top of the films by photolithographic imaging, and (iii) etching the films selectively to the mask.

FIG. 1 shows a Cascode amplifier circuit 10 which can utilize a unitary Cascode cell in accordance with aspects of the present disclosure. As shown in FIG. 1, the Cascode amplifier 10 includes a CS-FET 11 having a drain connected to the source of a CG-FET 12. The CS-FET 11 serves as an input transistor of the Cascode amplifier receiving an RF input, provided by an RF source 13, at a gate thereof. The Cascode amplifier output is provided at a drain of the CG-FET 12. As also shown in FIG. 1, the Cascode amplifier 10 includes other circuit elements, including a source resistor $R_s$, coupled between the RF source 13 and the gate of the CS-FET 11, inductors $L_g$, coupled to the gate of the CS-FET 11, $L_s$, coupled between the source of the CS-FET 11 and ground, and $L_L$ coupled to between the drain of the CG-FET and the voltage source $V_{dd}$, and input capacitor $C_1$ coupled between the source resistor $R_s$ and the inductor $L_g$, to implement an amplifying operation in conjunction with the transistors 11 and 12, in accordance with well-known principles of operation for Cascode amplifiers.

Figure 2A:
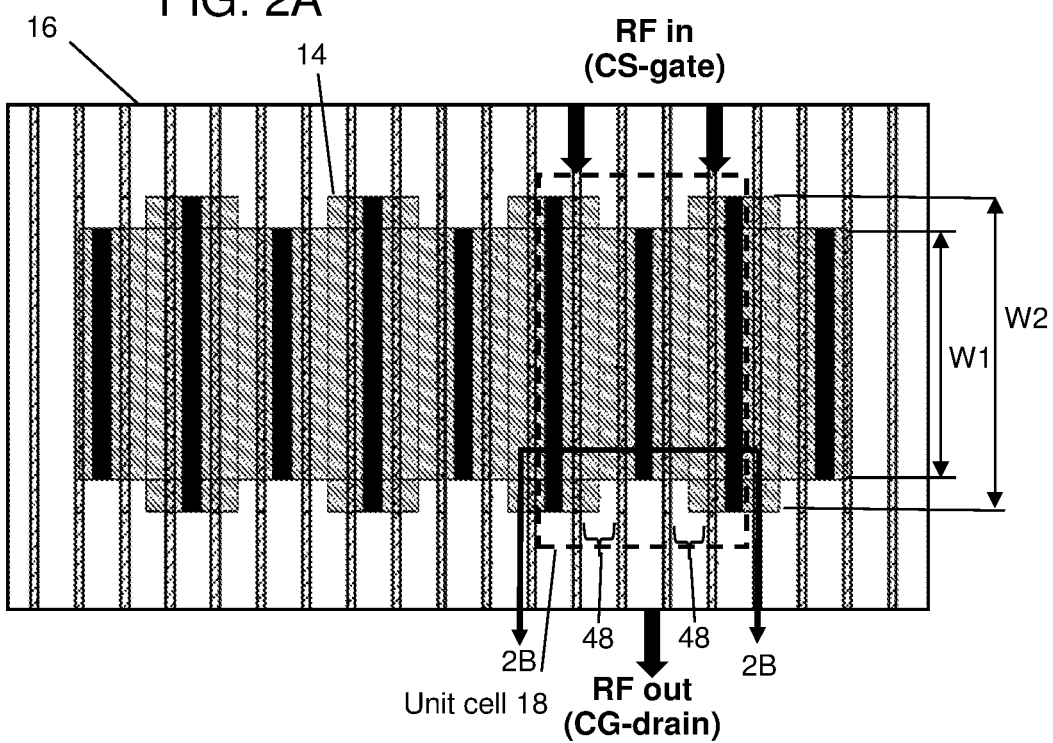
FIG. 2A shows a top view of a unitary Cascode cell, amongst other features, in accordance with aspects of the present disclosure.
Figure 2B:
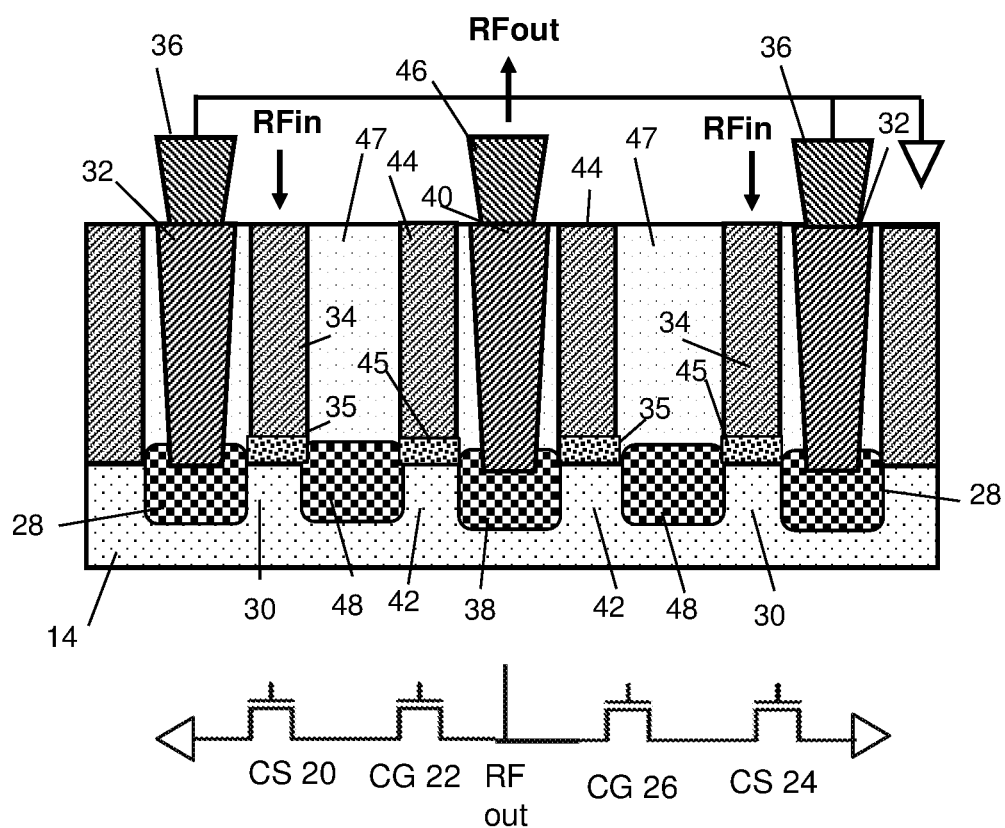
FIG. 2B shows a cross-sectional view taken across the line 2B-2B of the unitary Cascode cell shown in FIG. 2A, in accordance with aspects of the present disclosure.

FIG. 2A shows a top view of a unitary Cascode cell, amongst other features, and respective fabrication processes in accordance with aspects of the present disclosure. FIG. 2B shows a cross-sectional view of a unit cell 18 taken along the line 2B-2B shown in FIG. 2A. Referring to both FIGS. 2A and 2B, the structure includes a single common semiconductor region 14 forming a unitary Cascode cell. In embodiments, the single common semiconductor region 14 can be a diffused island region formed in a semiconductor substrate 16, an epitaxially grown island region on the semiconductor substrate 16, or a semiconductor substrate on an insulator in accordance with SOI technology. The single common semiconductor region 14 and the semiconductor substrate 16 can be composed of any suitable material including, but not limited to, Si, SiGe, SiGeC, SiC, GaAs, InAs, InP, and other III/V or II/VI compound semiconductors.

The single common semiconductor region 14 can be representative of a planar region or one or more fin structures. In this way, the transistors described herein can be provided as planar FETs or FinFETs. In the FinFET implementation, the fin structures can be formed using conventional sidewall image transfer (SIT) techniques. In the SIT technique, for example, a mandrel material, e.g., $SiO_2$, is deposited on a substrate, using conventional CVD processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions between narrow fin structures and/or wide fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped. In embodiments, the wide fin structures can also be formed during this or other patterning processes, or through other conventional patterning processes, as contemplated by the present disclosure.

Still referring to FIGS. 2A and 2B, the unit cell 18 includes two CS-FETs and two CG-FETs, specifically, a first CS-FET 20, a first CG-FET 22, a second CS-FET 24 and a second CG-FET 26. The first and second CS-FETs 20 and 24 each include a source region 28, a channel region 30, a source contact 32, a gate electrode 34, separated from the channel region 30 by a gate insulator 35, and a source metallization 36, coupled to ground. The first CG-FET 22 and the second CG-FET 26 each include a drain region 38, a drain contact 40, a channel region 42, a gate electrode 44 (separated from the channel region 42 by a gate insulator 45) and a drain metallization 46. The contacts 32 and 40 and the gate electrodes 34 and 44 are formed in a dielectric material 47 formed over the single common semiconductor region 14.

The gate electrodes 34 of the CS-FETs 22 and 26 receive RF input signals for the Cascode amplifier, and the drain metallization 46 of the CG-FETs 22 and 26 provide a RF output signal for the Cascode amplifier formed by the unit cell 18. In this embodiment, in which the unit cell 18 is formed to have two CS-FETs 20 and 24 and two CG-FETs 22 and 26 share a common drain region 38 and a common drain contact 40 to provide the RF output signal for the Cascode amplifier at the drain metallization 46.

In embodiments, the gate electrodes 34 and 44 and gate dielectrics 35 and 45 can be formed as part of gate structures which are FET structures formed by any known gate fabrication process, i.e., first gate process or replacement gate process. The FET structures comprise gate dielectrics 35 and 45 composed of a gate-dielectric material (e.g., high-k dielectric material), known workfunction metals and sidewall spacers (e.g., oxide or nitride). In the first gate process, the gate dielectric and workfunction metals (or poly) can be deposited using any conventional deposition methods, e.g., chemical vapor deposition (CVD), plasma enhanced CVD (PECVD), etc. Following the deposition of the materials, the materials can be subjected to a patterning process using conventional lithography and etching (RIE) processes. For the sidewall spacers, after deposition of the material over the patterned gate structures, an anisotropic etching process can be utilized to remove the sidewall spacer material.

Still referring to FIGS. 2A and 2B, the regions 28, 38 and 48 can be raised source and drain regions formed by a doped epitaxial growth process, as is known by those of ordinary skill in the art such that no further explanation is required for a complete understanding of the present disclosure. Alternatively, the regions 28, 38 and 48 can be diffused source and drain regions, formed in the single common semiconductor region 14. In embodiments, the regions 28, 38 and 48 can be formed by conventional ion implantation processes known by those of ordinary skill in the art such that no further explanation is required for a complete understanding of the present disclosure.

Contacts 32 and 40, gate electrodes 34 and 44 and metallizations 36 and 46 are formed by using conventional lithography, etching and deposition processes. For example, following the deposition of the dielectric material 47, trenches are formed in the dielectric material 47 to expose the diffused or epitaxial regions 28 and 38, and the channel regions 30 and 42. The gate dielectrics are then formed over the channel regions 30 and 42, and then metal material, e.g., tungsten, cobalt, etc. is then deposited within the vias, followed by a planarization process. The contacts 32 and 40, gate electrodes 34 and 44 and metallizations 36 and 46 can be formed by separate single damascene processes or a dual damascene process.

The contacts can include silidiced portions on the drain and source regions. For example, the silidiced portions can be formed using a silicide process. As should be understood by those of skill in the art, the silicide process begins with deposition of a thin transition metal layer, e.g., nickel, cobalt or titanium, over fully formed and patterned semiconductor devices (e.g., doped or ion implanted source and drain regions). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Still referring to FIGS. 2A and 2B, the doped connecting regions 48 serve as drain regions for the CS-FETs 20 and 24, source regions for the CG-FETs 22 and 26, and the connection between these respective source and drain regions. These doped connection regions 48 can be formed as raised doped epitaxial regions, as shown in FIG. 2B, or as diffused doped regions in the single common semiconductor region 14. By virtue of the multiple purposes served by the doped connecting regions 48, and the elimination of the need for metallization layers to connect the drain of the CS-FET 11 and the source of the CG-FET 12 in a Cascode connection, the resulting Cascode amplifier is smaller than a conventional Cascode, and has less additional resistance and capacitance. As a result, a Cascode utilizing the unitary Cascode constituted with the single common semiconductor region 14 disclosed herein has improved gain and linearity compared to a conventional Cascode amplifier.

Still referring to FIG. 2A, another aspect of the present disclosure is the construction of the single common semiconductor region 14 as a jogged structure having a first width W1 in some portions and a greater second width W2 in other portions. Specifically, in embodiments, the CG-FETs 22 and 26, are formed in the smaller width portions (e.g., having a width W1) of the single common semiconductor region 14, while the CS-FETs 20 and 24, are formed in the greater width second portions (e.g., having a width W2) of the single common semiconductor region 14. The widths W1 and W2 correspond to gate widths of the CS-FET and the CG-FETs, respectively.

An advantage of the jogged structure with the different widths W1 and W2 for the CG-FETs and the CS-FETs is that the smaller cell size for the CG-FETs 22 and 26 permits these transistors to handle greater voltages, which, correspondingly, allows using smaller gate lengths for the CS-FETs 20 and 24. In embodiments, the ratio between the widths W1 and W2 is that W2 is greater than or equal to W1 and less than or equal to 2×W1 (i.e. two times W1).

In the above discussed embodiments utilizing a jogged single common semiconductor region 14, the jog (i.e., the change in width of the single common semiconductor region 14 when viewed in a top view such as FIG. 2A) occurs in the doped connecting regions 48. In other words, as shown in FIG. 2A, the doped connecting regions 48 have a smaller width W1 in the areas of the doped connecting regions 48 which serve as the source for the CG-FETs, and have a greater width W2 in areas of the doped connecting regions 48 which serve as the drains of the CS-FETs.

Figure 3:
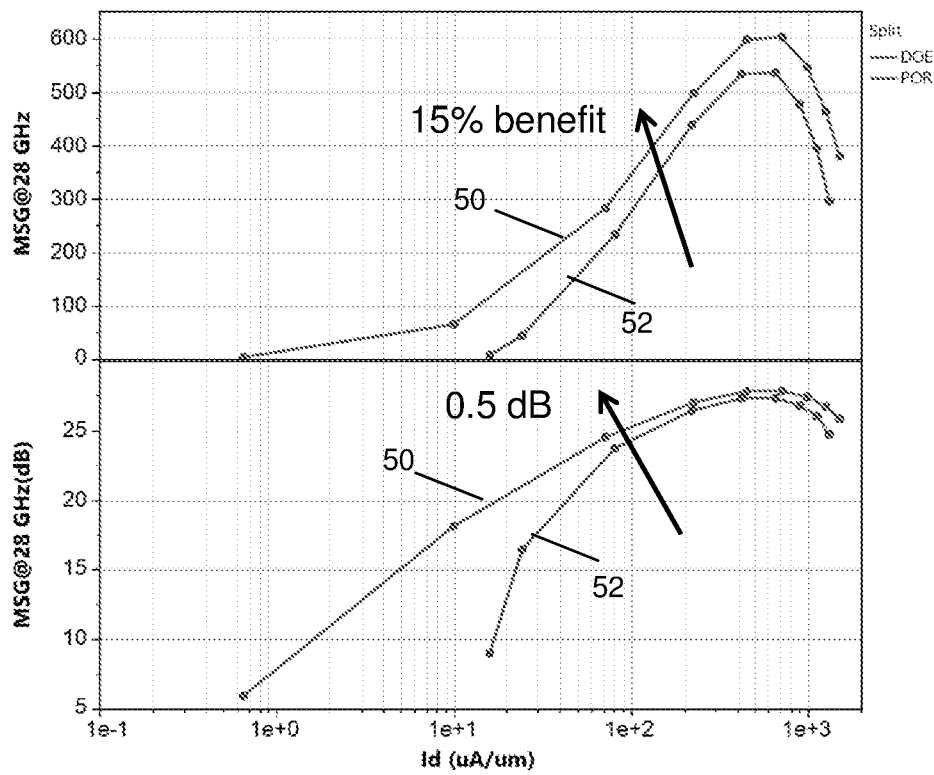
FIG. 3 shows a comparison graph comparing the structures described herein and a conventional device with CS-FETs and CG-FETs formed in separate island regions or separate substrates.
Figure 3:
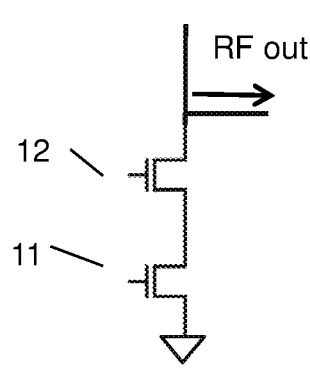

FIG. 3 shows comparison graphs comparing the structures described herein and a conventional device using separate semiconductor regions for the CS-FETs and the CG-FETs. In the graphs of FIG. 3, a PEX+HSPICE analysis is shown for the comparison between prior art and this disclosure. FIG. 3 shows the voltage levels and device parameters for a CS-FET 11 and a CG-FET 12 constructed using a unitary Cascode cell, as described above with regard to FIGS. 2A and 2B, compared to a similar device constructed using a conventional Cascode arrangement with separate cells for the CS-FETs and the CG-FETs. The Y-axis in the graphs shown in FIG. 3 shows the maximum stability gain (MSG) for two ranges, while the X-axis shows the drain current $I_d$ in µA/µm for the RF output signal. In particular, the Y-axis for the lower graph of FIG. 3 shows the maximum stability gain at 28 GHz (in the unit of dB) between 5 and 30, while the upper graph shows the maximum stability gain at 28 GHz (in absolute unit) between 0 and 600. The lines 50 show the results using a unitary Cascode cell, such as shown in FIGS. 2A and 2B, and the lines 52 show the results using a conventional Cascode arrangement with separate semiconductor regions for the CS-FETs and the CG-FETs. As can be appreciated from the two graphs, an improvement of about 15% (0.5 dB) is obtained using a unitary Cascode cell in accordance with the present disclosure. It is noted that the simulation is based on unoptimized ultra-scaled design, including unoptimized routing, high gouging resistance and high capacitance. Greater benefits can be expected with design optimization.

Although the above description pertains to FETs, it is noted that improvements could also be obtained for Cascode amplifiers using bipolar junction transistors (BJTs), and, in particular, forming common-emitter transistors and common-based transistors constituting a bipolar Cascode amplifier in a single common semiconductor region, as discussed herein with regard to FETs. Also, although the doped connection regions 48 have been described as including the drains of the CS-FETs and the sources of the CS-FETs, as well as providing a connection therebetween, in alternative embodiments the drains of the CS-FETs and the sources of the CG-FETs can be formed as separate doped epitaxial regions, or separate doped diffused regions, which each abut the doped connection regions 48 so that the doped connections regions 48 serve as connection regions for these separate source and drain regions. With this arrangement, the use of the doped connection regions 48 still avoids the requirement for metallization to connect the separate drain and source regions, thereby achieving advantages in reducing undesirable additional resistance and capacitance. This arrangement also allows for easily providing different doping levels for the source and drain regions compared to doping levels for the doped connection regions 48.

The unitary Cascode cells can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a common gate FET (CG-FET) in a first portion of a single common semiconductor region, the CG-FET comprising a source region and drain region;
   a common source FET (CS-FET) in a second portion of the single common semiconductor region, the CS-FET comprising the source region and the drain region; and
   a doped connecting region of the single common semiconductor region, connecting the drain region of the CS-FET and the source region of the CG-FET.

2. The structure of claim 1, wherein the doped connecting region is a doped epitaxial region.

3. The structure of claim 1, wherein the doped connecting region is a diffused region in a substrate.

4. The structure of claim 1, wherein the single common semiconductor region is an island region in a substrate.

5. The structure of claim 4, wherein the second portion of the single common semiconductor region is wider than the first portion of the single common semiconductor region.

6. The structure of claim 5, wherein the first portion has a width W1 and the second portion has a width W2, wherein W2 is a value which is in a range between being equal to or greater than W1 and equal to or less than 2×W1 (two times W1).

7. The structure of claim 6, wherein the CS-FET has a gate length smaller than a gate length of the CG-FET.

8. The structure of claim 1, wherein a gate of the CS-FET is configured to receive an RF input signal and the drain region of the CG-FET is configured to provide an RF output signal.

9. The structure of claim 1, wherein the CS-FET and the CG-FET are selected from a group consisting of at least one of: FinFETs and planer FETs.

10. The structure of claim 9, wherein the doped connecting region is in a third portion of the single common semiconductor region and includes the drain region of the CS-FET and the source region of the CG-FET.

11. A semiconductor structure comprising:
    a common gate FET (CG-FET) in a first portion of a single common semiconductor region; and
    a common source FET (CS-FET) in a second portion of the single common semiconductor region;
    wherein the single common semiconductor region is a jogged semiconductor region having different widths in different portions of the single common semiconductor region.

12. The structure of claim 11, wherein the second portion of the single common semiconductor region is wider than the first portion of the single common semiconductor region.

13. The structure of claim 12, wherein a drain of the CS-FET and a source of the CG-FET are commonly located in a doped connecting region of the single common semiconductor region, connecting the drain of the CS-FET and the source of the CG-FET.

14. The structure of claim 13, wherein the doped connecting region is a doped epitaxial region.

15. The structure of claim 14, wherein the single common semiconductor region is an island region in a substrate.

16. The structure of claim 15, wherein the first portion has a width W1 and the second portion has a width W2, where W2 includes a value which is in a range of being equal to or greater than W1 and equal to or less than 2×W1 (two times W1), and the CS-FET has a gate length smaller than a gate length of the CG-FET.

17. The structure of claim 13, further comprising a second CS-FET in another portion of the single common semiconductor region, the second CS-FET including the drain connected to the source of a second CG-FET in a different portion of the single common semiconductor region, wherein the different portion is located between the other portion and the doped connecting region, and the CG-FET and the second CG-FET share a common drain region forming an output of a Cascode cell comprised of the CS-FET, the CG-FET and the second CS-FET.

18. A method of forming a Cascode cell comprising:
    forming a common gate FET (CG-FET) in a first portion of a single common semiconductor region, the CG-FET comprising a source region and drain region;
    forming a common source FET (CS-FET) in a second portion of the single common semiconductor region, the CS-FET comprising the source region and the drain region; and
    forming a doped connecting region in the single common semiconductor region, connecting the drain region of the CS-FET and the source region of the CG-FET,
    wherein the single common semiconductor region is a jogged semiconductor region having different widths for the first portion and the second portion in the single common semiconductor region.

19. The method of claim 18, wherein the first portion has a width W1 and the second portion has a width W2, where W2 is a value in a range of being equal to or greater than W1 and equal to or less than 2×W1 (two times W1), and wherein the CS-FET has a gate length smaller than a gate length of the CG-FET.

20. The method of claim 18, wherein the doped connecting region is a doped epitaxial region.

* * * * *